US007236908B2

(12) United States Patent
Timko et al.

(10) Patent No.: US 7,236,908 B2
(45) Date of Patent: Jun. 26, 2007

(54) FUZZY TIME-OF-USE METERING AND CONSUMPTION MONITORING USING LOAD PROFILE DATA FROM RELATIVE TIME TRANSMIT-ONLY DEVICES

(75) Inventors: Kevin J. Timko, Cary, NC (US); Sean M. Scoggins, Rolesville, NC (US)

(73) Assignee: Elster Electricity, LLC, Raleigh, NC (US)

( * ) Notice: Subject to any disclaimer, the term of this patent is extended or adjusted under 35 U.S.C. 154(b) by 0 days.

(21) Appl. No.: 11/289,054

(22) Filed: Nov. 29, 2005

(65) Prior Publication Data

US 2007/0124109 A1 May 31, 2007

(51) Int. Cl.
*G01R 11/58* (2006.01)

(52) U.S. Cl. .......................... 702/176; 702/61; 702/62; 705/412

(58) Field of Classification Search ................ 702/176, 702/61, 62
See application file for complete search history.

(56) References Cited

U.S. PATENT DOCUMENTS

| | | | | |
|---|---|---|---|---|
| 4,804,957 | A | 2/1989 | Selph et al. | 340/870.03 |
| 4,940,976 | A | 7/1990 | Gastouniotis et al. | 340/870.02 |
| 5,186,150 | A | 2/1993 | Sekine | 123/494 |
| 5,988,848 | A | 11/1999 | Berstecher et al. | 364/148 |
| 6,020,734 | A | 2/2000 | Grisham et al. | 324/103 |
| 6,082,169 | A | 7/2000 | Bach | 73/1.34 |
| 6,263,055 | B1 | 7/2001 | Garland et al. | 379/106.05 |
| 6,323,774 | B1 | 11/2001 | Mitchell | 340/606 |
| 6,333,975 | B1 | 12/2001 | Brunn et al. | 379/106.03 |
| 6,411,909 | B1 | 6/2002 | Charrier et al. | 702/45 |
| 6,842,706 | B1 | 1/2005 | Baraty | 702/61 |
| 6,865,450 | B2 | 3/2005 | Masticola et al. | 700/291 |
| 6,867,707 | B1 | 3/2005 | Kelley et al. | 340/870.02 |
| 2002/0135493 | A1 | 9/2002 | Moreno et al. | 340/870.02 |
| 2002/0198679 | A1 | 12/2002 | Victor et al. | 702/176 |
| 2003/0055677 | A1 | 3/2003 | Brown et al. | 705/1 |
| 2003/0123442 | A1 | 7/2003 | Drucker et al. | 370/392 |

(Continued)

OTHER PUBLICATIONS

"Water Interface Management Unit", Silver Springs Network, 2005, 2 pages, http://www.silverspringnetworks.com/download/SilverSpringNetworks_WaterIMU.pdf, 2 pages, no date.

(Continued)

*Primary Examiner*—Hal Wachsman
(74) *Attorney, Agent, or Firm*—Woodcock Washburn LLP

(57) ABSTRACT

A system and method provide Time-of-Use (TOU) rate schedules that are bound by windows of time, i.e., a type of fuzzy switch time, which is bounded on both sides, rather than instantaneous switch times. The fuzzy TOU schedule defines the time of a tier switch as the end time of the first completed interval recorded after the start of some window of time. A monitoring system may be included that implements configurable usage filters that allow for the classification of usage in terms of interval data. Usage filters can be defined so that they are applied against individual interval readings, various aggregations of interval readings, and/or the statistical products of interval readings, etc. A filtering algorithm allows for the comparison of incoming and/or historical interval data against defined usage and schedule filters to determine if usage is abnormal and should be investigated further.

20 Claims, 4 Drawing Sheets

U.S. PATENT DOCUMENTS

| | | | | |
|---|---|---|---|---|
| 2004/0001008 | A1 | 1/2004 | Shuey et al. | 340/870.02 |
| 2004/0006439 | A1 | 1/2004 | Hunter | 702/61 |
| 2004/0064217 | A1 | 4/2004 | Addink et al. | 700/284 |
| 2005/0119841 | A1* | 6/2005 | Martin | 702/61 |
| 2005/0149345 | A1 | 7/2005 | Daily | 705/1 |
| 2005/0190066 | A1 | 9/2005 | Schleich et al. | 340/605 |
| 2005/0240540 | A1* | 10/2005 | Borleske et al. | 705/401 |
| 2005/0270173 | A1 | 12/2005 | Boaz | 340/870.02 |
| 2006/0072465 | A1* | 4/2006 | Scoggins et al. | 370/241 |
| 2006/0135119 | A1* | 6/2006 | Kumar et al. | 455/405 |
| 2006/0224335 | A1* | 10/2006 | Borleske et al. | 702/62 |

OTHER PUBLICATIONS

"UtilityIQ AM-Advanced Metering Application", Silver Springs Network, 2005, http://www.silverspringnetworks.com/download/SilverSpringNetworks_UtilityIQ-AM.pdf, 4 pages, no date.

"The Star® Fixed-Network AMR System", Hexagram, Inc., http://hexagram.com/star.shtml, 7 pages, no date.

StatSignal, http://www.statsignal.com/technology.asp, 4 pages, no date.

Macke, S. et al., "BMFO User Guide", Bulk Meter Flow and Operations, Northern Governorates Water Administration, 2003, (No month), http://bmfo.sourceforge.net/doc/user/en/bmfo_user_guide.pdf, 12 pages.

"AMR-Selecting the Right System", Water Watcher, Neptune Technology Group Inc., Jun. 2003, http://neptunetg.com/emplibrary/WWjune03.pdf, 20 pages, no date.

Wenzel, D., "Badge Meter Connectivity", Jun. 2005, www.bagermeter.com/pdf/new/con6-05.pdf, 16 pages.

Purcell, D., "AEWRS (aka HQRADDS) Redesign update", *Public Works Digest,* Sep./Oct. 2004, 16(5), 3 pages.

* cited by examiner

FUZZY TIME-OF-USE METERING AND CONSUMPTION MONITORING USING LOAD PROFILE DATA FROM RELATIVE TIME TRANSMIT-ONLY DEVICES

FIELD OF THE INVENTION

The present invention relates to wireless networks for collecting data, and more particularly, to systems and methods for applying time-of-use schedules to relative time transmit-only devices on a fixed network Automated Meter Reading (AMR) system and to determine excess consumption via such devices.

BACKGROUND OF THE INVENTION

An automated means for collecting meter data involves a fixed wireless network. Devices such as, for example, repeaters and gateways are permanently affixed on rooftops and pole-tops and strategically positioned to receive data from enhanced meters fitted with radio-transmitters. Typically, these transmitters operate in the 902-928 MHz range and employ Frequency Hopping Spread Spectrum (FHSS) technology to spread the transmitted energy over a large portion of the available bandwidth. Data is transmitted from the meters to the repeaters and gateways and ultimately communicated to a central location.

With the increased sophistication of meter reading techniques has come the corresponding sophistication of billing techniques. For example, energy meters may be operated as either a "demand" meter or as a "time-of-use" (TOU) meter. TOU meters allow a power company to provide greater differentiation by which the energy is billed. Energy metered during peak hours will be billed differently than electrical energy billed during non-peak hours. Also, demand meters allow for a billing charge based on the maximum amount of power consumed in a given period of time (e.g., 15 minutes). As a result, keeping track of time in the meter, both relative and absolute, has become more significant.

However, devices without clocks (e.g., water and gas meters) traditionally have not been able to provide TOU metering. TOU metering would be beneficial in the context of water and gas metering because TOU pricing helps distribute demand more evenly over a period of time. In the context of electricity, electrical energy is generated and reserve capacity not easily stored. While water and gas supplies are not generated, they must be pressurized and reserve capacity must be pumped to storage containers. Demand on the water and gas systems in the form of usage at endpoints results in a drop in system-wide pressure, which must be overcome using pumps. Since these pumps are almost always electrical, water usage is tied, though somewhat indirectly, to electricity usage. Demand on the water supply system is therefore related to demand on the electrical system and some of the same reasons to evenly distribute demand, or move demand into off-peak times, exist with water and gas systems as with electricity systems.

In addition, as water supplies in urban areas become more and more limited, municipalities may look for ways to limit water use (e.g., by using punitive pricing or restricting use outright). Examples of usage restrictions include daily restrictions on commercial and residential irrigation users, e.g., odd/even watering days, prohibited watering days, etc. TOU water metering will offer additional pricing and enforcement flexibility. For example, some municipalities have implemented limits on irrigation use by limiting irrigation to particular days of the week. This is typically enforced by visual inspection, but is fundamentally a time of use issue. Therefore, with TOU water metering, municipalities could penalize usage outside of certain time windows, for example mid-day (which is less efficient than late evening or early morning) or off-day irrigation, with higher pricing.

Water theft is another area of increasing concern for not only municipalities, but also for the individual consumers that may be affected. It would be desirable to monitor usage behavior via the data collection system. By comparing collected interval data against predefined usage profiles and schedules, suspect usage can be identified and the appropriate authorities automatically notified. Future visual inspections can thus be more appropriately targeted to suspected violators.

Therefore, there is a need to provide efficient techniques for providing TOU billing and data collection in relative time, clock-less metering devices, as well as a mechanism to detect fraudulent consumption.

SUMMARY OF THE INVENTION

The invention provides a system and method for providing Time-of-Use (TOU) rate schedules to relative-time meters (e.g., water and gas meters) in a utility metering network. The system may be used to determine usage based on filtering interval data received from the relative-time meters. The TOU rate schedules are bound by windows of time, i.e., a type of fuzzy switch time, which is bounded on both sides, rather than instantaneous switch times. A system of TOU calculations may be implemented based on the relative-time load profile (LP) data generated by the meters and the TOU schedule definition. The fuzzy TOU schedule defines the time of a tier switch as the end time of the first completed interval recorded after the start of some window of time. The maximum length of the intervals transmitted by a relative time end device defines the length of the window.

A monitoring system may be included that implements configurable usage filters that allow for the classification of usage in terms of interval reading data. Usage filters can be defined so that they are applied against individual interval readings, various aggregations of interval readings, and/or the statistical products of interval readings, etc. Configurable usage schedule filters allow for the specification of usage restrictions in terms of various TOU criteria. Schedule filters can be defined so that they are applied against periods of the day, days, days of the week, etc. A filtering algorithm allows for the comparison of incoming and/or historical interval data against defined usage and schedule filters to determine if usage is abnormal and should be investigated further.

These and other novel features will be described in further detail below.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary constructions of the invention; however, the invention is not limited to the specific methods and instrumentalities disclosed. In the drawings.

DETAILED DESCRIPTION OF ILLUSTRATIVE EMBODIMENTS

Exemplary systems and methods for gathering meter data are described below with reference to FIGS. 1-4. It will be appreciated by those of ordinary skill in the art that the description given herein with respect to those figures is for exemplary purposes only and is not intended in any way to limit the scope of potential embodiments.

Generally, a plurality of meter devices, which operate to track usage of a service or commodity such as, for example, electricity, water, and gas, may be operable to wirelessly communicate with each other, and/or to communicate with one another via a wireline network. A collector may be operable to automatically identify and register meters for communication with the collector. When a meter is installed, the meter becomes registered with the collector that can provide a communication path to the meter. The collectors may receive and compile metering data from a plurality of meter devices via wireless communications. Also, a communications server communicates with the collectors to retrieve the compiled meter data.

Figure 1:
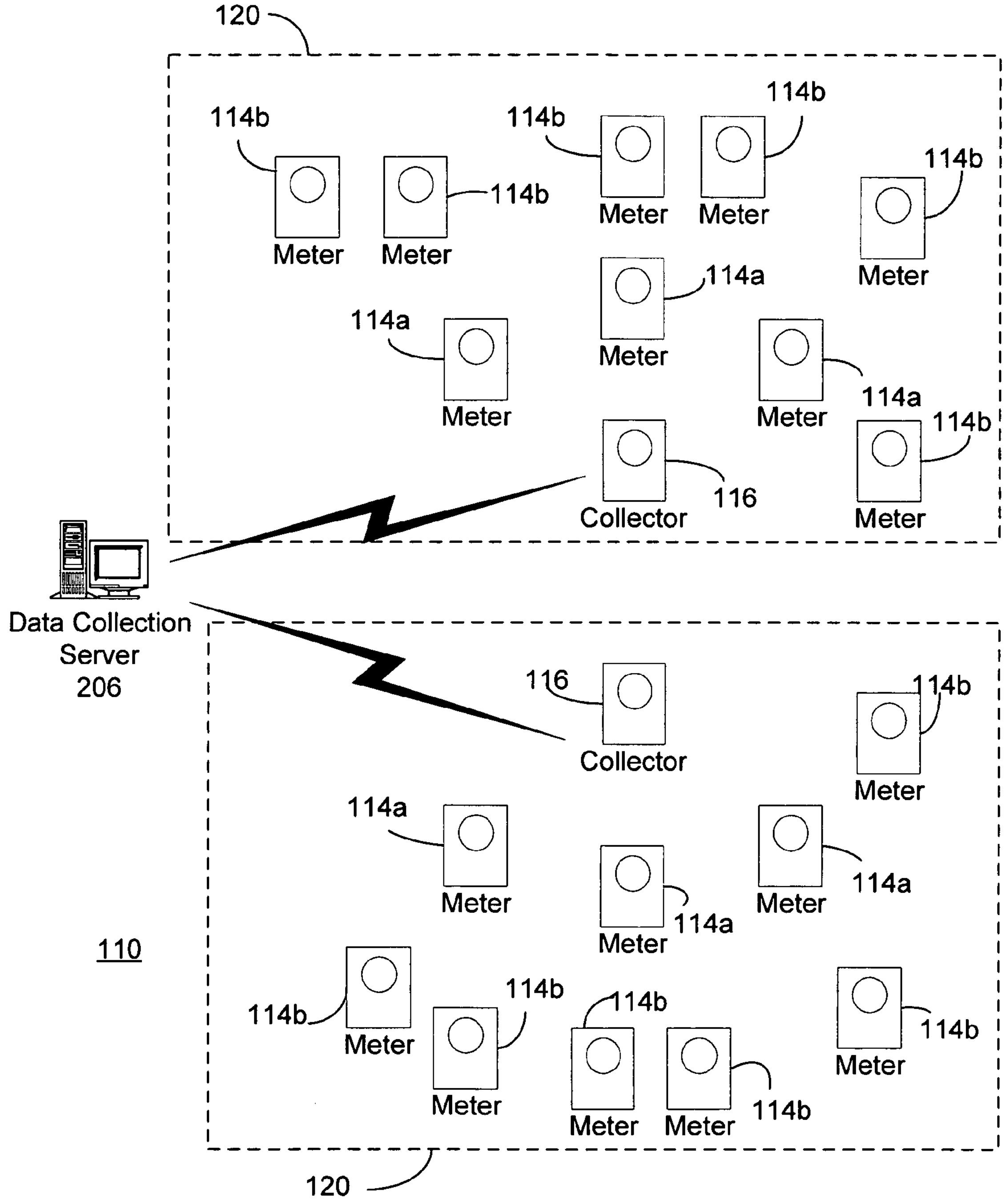
FIG. 1 is a diagram of a wireless system for collecting data from remote devices.

FIG. 1 provides a diagram of an exemplary metering system 110. System 110 comprises a plurality of meters 114, which are operable to sense and record usage of a service or commodity such as, for example, electricity, water, or gas. Meters 114 may be located at customer premises such as, for example, a home or place of business. Meters 114 may comprise an antenna and may be operable to transmit data, including service usage data, wirelessly or via wired connections. Meters 114 may be further operable to receive data wirelessly as well. In an illustrative embodiment, meters 114 may be, for example, electrical meters manufactured by Elster Electricity, LLC.

System 110 may further comprise collectors 116. Collectors 116 also may be meters operable to detect and record usage of a service or commodity such as, for example, electricity, water, or gas. Collectors 116 may comprise an antenna and may be operable to send and receive data wirelessly. In particular, collectors 116 may be operable to send data to and receive data from meters 114. In an illustrative embodiment, meters 114 and/or collectors 116 may be, for example, an electrical meter manufactured by Elster Electricity, LLC.

A collector 116 and the meters 114 for which it is configured to receive meter data define a subnet/LAN 120 of system 110. In the context of networking, meters 114 and collectors 116 may be considered as nodes in the subnet 120. For each subnet/LAN 120, data may be collected at collector 116 and periodically transmitted to a data collection server 206. The data collection server 206 may store the data for analysis and preparation of bills, for example, among other uses. The data collection server 206 may be a specially programmed general purpose computing system and may communicate with collectors 116 wirelessly or via a wireline connection such as, for example, a dial-up telephone connection or fixed wire network.

Generally, collector 116 and meters 114 may communicate with and among one another using any one of several robust wireless techniques such as, for example, frequency hopping spread spectrum (FHSS) and direct sequence spread spectrum (DSSS). As illustrated, meters 114*a* may be referred to as "first level" meters that communicate with collector 116, and meters 114*b* may be referred to as "higher level" meters that communicate with other meters in the network and that forward information to the collector 116.

Figure 2:
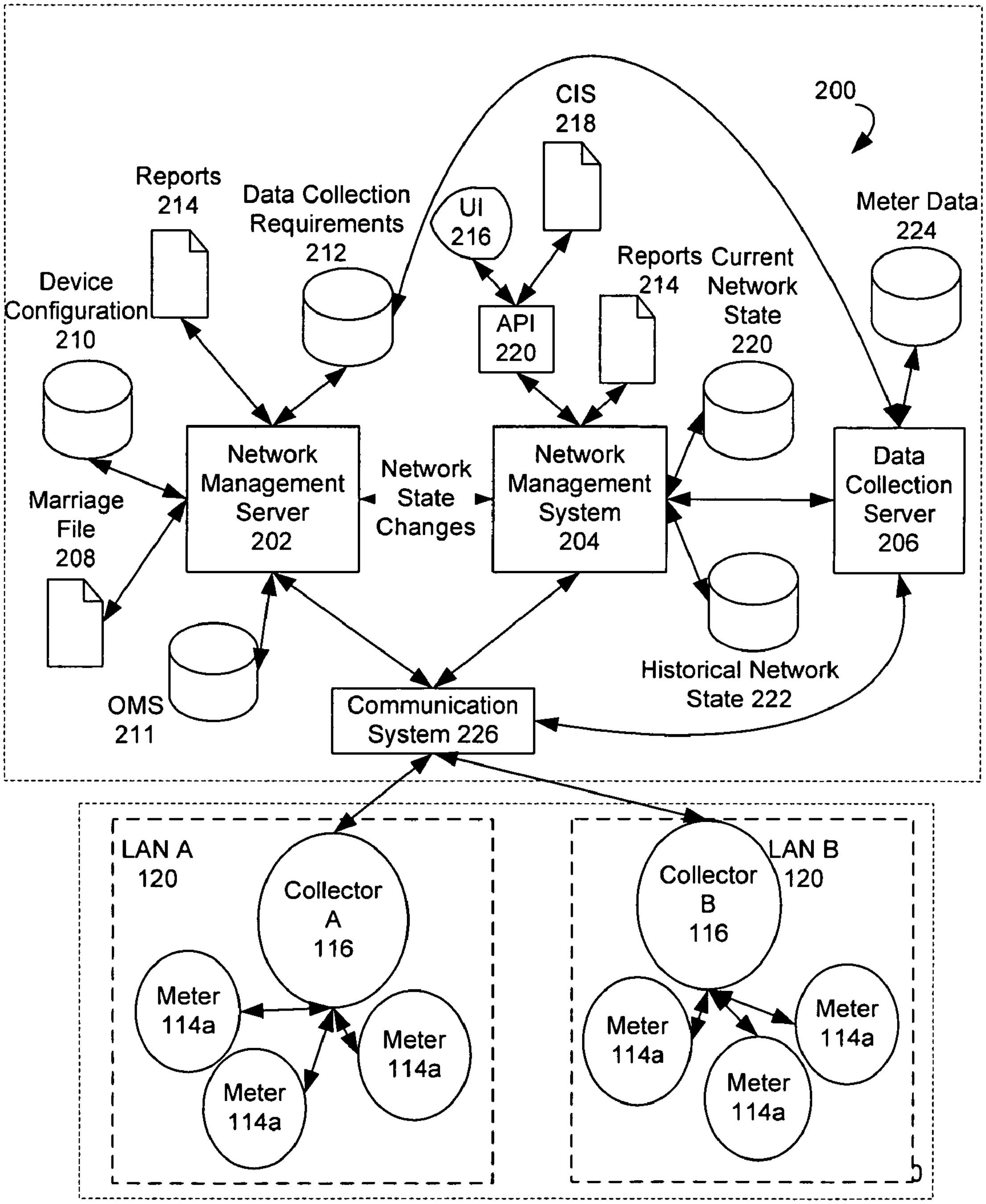
FIG. 2 expands upon the diagram of FIG. 1 and illustrates a system in which the present invention is embodied.

Referring now to FIG. 2, there is illustrated a system 200. The system 200 may include a network management server 202, a network management system (NMS) 204 and a data collection server 206 that together manage one or more subnets/LANs 120 and their constituent nodes. The NMS 204 may track changes in the network state, such as new nodes registering/unregistering with the system 200, node communication paths changing, etc. This information may be collected for each subnet/LAN 120 and may be detected and forwarded to the network management server 202 and data collection server 206.

Communication between nodes and the system 200 may be accomplished using a LAN identification, however customers also may query and communicate with nodes using their own identifier. To this end, a marriage file 208 may be used to correlate a customer serial number, a manufacturer serial number and LAN identification for each node (e.g., meters 114*a* and collectors 116) in the subnet/LAN 120. A device configuration database 210 may store configuration information regarding the nodes. For example, in the metering system 110, the device configuration database may include data regarding time of use (TOU) switchpoints, etc. for the meters 114*a* and collectors 116 communicating to the system 200. A data collection requirements database 212 may contain information regarding the data to be collected on a per node basis. For example, a user may specify that metering data such as load profile, demand, TOU, etc. is to be collected from particular meter(s) 114*a*. Reports 214 containing information on the network configuration may be automatically generated or in accordance with a user request.

A network management system (NMS) 204 maintains a database describing the current state of the global fixed network system (current network state 220) and a database describing the historical state of the system (historical network state 222). The current network state 220 may contain data regarding current meter to collector assignments, etc. for each subnet/LAN 120. The historical network state 222 may be a database from which the state of the network at a particular point in the past can be reconstructed. The NMS 204 may be responsible for, among other things, providing reports 214 about the state of the network. The NMS 204 may be accessed via an API 220 that is exposed to a user interface 216 and a Customer Information System (CIS) 218. Other external interfaces may be implemented as well. In addition, the data collection requirements stored in the database 212 may be set via the user interface 216 or CIS 218.

The data collection server 206 collects data from the nodes (e.g., collectors 116) and stores the data in a database 224. The data may include metering information, such as energy consumption and may be used for billing purposes, etc. by a utility provider.

The network management server 202, network management system 204 and data collection server 206 may communicate with the nodes in each subnet/LAN 120 via a communication system 226. The communication system 226 may be a Frequency Hopping Spread Spectrum radio network, a mesh network, a Wi-Fi (802.11) network, a Wi-Max (802.16) network, a land line (POTS) network, etc., or any combination of the above and enables the system 200 to communicate with the metering system 110.

In a system such as that shown in FIGS. 1 and 2, there are instances when the meter's internal time clock drifts. Devices with receivers have means to receive messages to update the time and to maintain the real time within the device. However, transmit only devices, for example, may not have a mechanism that allows the time to be synchronized to the real time. In addition, devices that are capable of receiving and transmitting, and thus receiving time updates, may require backup or validation of those received time updates. The disclosed embodiments apply to both types of systems, as well as others.

An embodiment of the invention may provide techniques for maintaining a relative time in a device, like a meter 114, for example. The relative time may then be mapped to an absolute time in a receiving device, for example the meter 114 and/or the collector 116.

A module, for example a communication module, in a meter or other type of the automated meter reading (AMR) device may maintain a relative time clock. The relative time clock may be a timer that it internal to the meter, and may operate independently of an absolute time input. The relative time clock in the meter or AMR device may allow the AMR device to read the meter to which it is attached and may allow the meter to transmit its data, both of which may be scheduled, on a periodic basis.

A meter read may be, for example, a snapshot of the current consumption value of the meter. The frequency with which the meter read is conducted may be referred to as a read interval. The read interval determines an interval length of interval data. The meter read can be accomplished by an accumulation of pulses or an absolute value read from the meter device. The read meter data may be stored in a memory, register, or other data storing mechanism in the meter device.

After reading the meter consumption value, the communication module in the meter or AMR device may compute the interval data by calculating the difference between the last consumption value read and the previous consumption value read. The AMR device also may apply a preset divisor in order to ensure the interval fits in the allotted memory space. The data that is read also may be assigned a sequence number and stored in a log.

It should be appreciated that the interval at which the meter 114 may record the data and the interval at which the meter 114 or communication module transmits that data up to the next item in the network, for example the collector 116 or another meter, may be different. For example, the communication module in the meter 114 may remain in a low power or power off state and "wake up" every hour, for example, to read the meter and to record the interval data, even though the meter 114 may transmit data every four hours. In fact, because the power consumed by the meter 114 in transmitting data often is greater than the power consumed from simply recording the meter data, it may be desirable and more efficient to increase the period between transmissions from the communication module to a number greater than the period between data reads. Therefore, the meter read period may either be a time period over which pulses are accumulated or the frequency at which the communications module "wakes up" and reads the meter register. Also, it should be appreciated that the meter read period may be set at a value that includes other considerations, like power usage, battery availability, etc.

It should also be appreciated that the periodicity of the meter reads may be decreased (e.g., 15 minute intervals) in order to provide a finer time resolution. Also, it may be desirable to increase the meter module's memory and radio frequency (RF) message payload such that the meter 114 may store and transmit more than 24 intervals of data. The number of intervals and time of the intervals are provided merely as an example and are not meant to be exclusive. The unlimited design values that contemplate tradeoffs in power, memory, and processing speed, just to name a few, are well within the scope of the described embodiments.

In operation, the communication module in the meter 114 may transmit a message to another device or devices capable of receiving the message, for example, a collector 116 and/or another meter. Although the collector 116 may be described as being the receiving device, it should be appreciated that any of the other network elements capable of receiving may receive the message. The message may include all or a portion of the recorded interval log, as well as the sequence number of the most recent entry.

Upon being received, the message may be time-stamped or given a time value by the receiving device. For example, where the transmission interval is designated as fifteen minutes, the message and interval data may be time-stamped to a resolution of fifteen minutes. The receiving device may then forward the message, with the added time-stamp, to the collecting device 116, for example. It should be appreciated that the collector 116 and the receiving device also may be utility meters. Where the entire interval data log is sent with every transmission (e.g., 24 intervals), the collecting device 116 may determine which intervals it has not yet stored (e.g., based on the sequence number of the received transmission), and may add the intervals to its log. The collecting device 116 may then convert the interval number to an absolute timestamp or time value, and may associate it with the newest interval.

The collecting device 116 therefore may aggregate the periodic transmissions from the meter 114. As such, the collecting device 116 may store multiple days of load profile data for each meter 114.

The data collection server 206 may then read the collector 116. In one embodiment, the data collection server 206 may read the collector 116 by evaluating the sequence number to read data it has not yet received. The data collection server 206 may have access to information not contained in the message transmitted from the meter 114 via a "marriage file" provided by the collecting device 116. For example, the data collection server 206 may use a divisor used by the meter 114 to convert the received interval data to engineering units, thereby may store and reporting the interval data in human understandable units.

In addition to periodic transmissions of data from meter 114, the transmit period may be programmed to vary randomly. Randomly transmitting the data may prevent two proximate meters from undesirably transmitting at the same time to the same collector, such that the collector 116 and/or the meter with receiver 114 can receive transmissions from two different devices, but not at the same time. Therefore, allowing the meters to randomly transmit their data may increase the probability that a greater number of transmitted messages may be received and stored by the collector 116, and/or received and stored by the meter 114 such that it can be forwarded to the collector 116. The degree of uncertainty may therefore increases the length of the interval (e.g., 1 hour). While the relaying device, for example the collector 116, stamps the message with the 15-minute interval, for example, the reading device (e.g., data collection server 206) may assign the message to the nearest interval boundary prior to the stamped time.

It should be appreciated that any of meters 114 may be a two-way device capable of receiving and transmitting data and/or a one-way device capable of transmitting data. Furthermore, the scope of the contemplated embodiments are not limited to the transmit/receive capabilities of any of the devices, but instead contemplate devices of any communication capability.

Once the data collection server 206 establishes the time of its first read, it may use that boundary for each subsequent read. However, because the time of the meter 114 may drift over time, the data collection server 206 may act to verify that the same boundary definition continues to be valid with each read. Once the time has drifted enough for the current boundary to be invalid, the data collection server 206 may act to correct the interval time-stamp for the new data and resynchronize to the new boundary. These changes may be marked with an event flag to indicate to the end user of the data that an adjustment was made.

Often, it may be necessary to allow for the collection of interval data at higher resolution intervals. For example, when a customer service issue requires finer resolution of data in order to facilitate troubleshooting of a problem. However, because the collector 116 may have a defined amount of memory that can be allocated to collecting interval data from the meter 114 it may be necessary to consider techniques other than the addition of memory to the collector 116.

For example, the system 200 may be configured to decrease the number of meters 114 for which the particular collector 116 stores interval data. This may be accomplished by using the data collection server 206 to dynamically configure the collector 116 to collect interval data for a subset of the originally planned meters. For example, the collector 116 may store interval data for certain identified meters 114. For the other meters not separately identified, the collector 116 may be made to store a smaller portion of the typical data (e.g., total consumption and status information). Therefore, this technique allows the system 200 to more efficiently optimize the memory available in the collector 116 by saving the expense of installing additional collectors into the system 200, or having to install additional memory on a given collector.

As part of the typical operation of a fixed network system as described above, it should be appreciated that data from a single meter 114*a* may be received by multiple collectors 116. After identifying the user's subset of meters 114, the data collection server 206 may group the meters into those applicable to a given collector 116. Moreover, the data collection server 206 may instruct multiple collectors to store interval data for the same meter 114*a*. In fact, the mesh network architecture and path diversity provided by the meters that are capable of receiving the transmit message from other meters allow for a robust data collection system. The data collection server 206 can receive data from the meter 114*a* through multiple collectors. As discussed, the data collection server 206 may determine if the data it receives from the collector 116 is new or old data, such that the new information is stored data, and the old data is perhaps discarded.

In addition to time-stamping, a method may be available for date-stamping by the system 200 for devices that otherwise typically do not track the date. For example, both the transmit-only meters, transmit and receive meters, and certain collectors that receive the transmit message may not contain date information. Other collectors capable of date-stamping may use the date and time that it maintains internally, as well as the time stamp provided by the transmit and receive meters and other collectors.

The lack of a common clock within the transmit-only relative-time devices creates the possibility that interval data from multiple relative-time devices will not be aligned to a common clock boundary. As noted above, the interval times may be aligned with a common clock on 15-minute boundaries, but the particular 15 minute boundary is not the same across devices or even over time with the same device. That is, device A could be reporting intervals aligned with the :15 clock boundary, while device B reported intervals aligned with the :30 boundary. Moreover, because of clock drift in the system, interval data from device A could spontaneously shift alignment to the :30 or :00 boundary over time. So in general, the alignment of intervals to clock boundaries is arbitrary in a system of relative time devices. The impact of this on TOU metering is that tier switch times cannot be defined in terms of instantaneous changes based on a global clock.

Because the interval length of the load profile (LP) data is the smallest time resolution to which the usage is known, intervals should not be "split" across TOU tiers. For example, if a tier switch is defined to occur at 02:00, and a LP interval is recorded from 1:45-2:45, then some unknown portion of that interval was recorded in the previous tier and some other unknown portion of that interval was recorded in the next tier. One approach to resolving this misalignment of LP data and tier switch times is to prorate the usage in the LP interval based on the amount of time the interval was in each tier.

In this example, since 15 minutes of the interval were recorded in the previous tier, and 45 minutes were recorded in the next tier, 25% of the usage represented by the interval could be accumulated in the previous tier and 75% of the usage accumulated in the next tier. However, there are drawbacks to this approach. The end customer may be penalized for usage that was actually in the lower rate tier. Also, the end customer only knows the TOU schedule and does not know what period around the switch times that usage may actually be charged to the higher tier. In addition, nothing ensures that the customer will not be penalized twice, once on entry to the lower-priced tier and once on exit because in both cases the proportional assignment may allocate some of the usage to a higher rate tier.

In view of the above, provided herein is a TOU schedule that is bounded by "windows" of time, i.e., a type of fuzzy switch time, which is bounded on both sides, rather than instantaneous switch times. A system of TOU calculation may be implemented based on the relative time LP data and this TOU schedule definition. The fuzzy TOU schedule defines the time of a tier switch as the end time of the first completed interval recorded after the start of some window of time. The maximum length of the intervals transmitted by a relative time end device defines the length of the window.

In accordance with the above, if the metering devices in question transmit a completed interval every 60 minutes, then a tier switch might be defined as happening between 02:00 and 03:00, as opposed to exactly at 02:00. This application of the fuzzy switch time to interval data is preferably done for each end device, because the interval end times are not aligned to each other. For example, if an interval for device A was closed at 02:15, and an interval for device B was closed at 02:45, then device A would experience a (virtual) tier switch at 02:15, while device B would experience a (virtual) tier switch at 02:45.

The above has several advantages over a conventional proportional assignment. If the transmit time (interval length) of the end devices is constant, any particular customer's switch times will be constant. That is, if a tier switch occurs for a customer at 02:15 today, it will occur at 02:15 tomorrow, provided the tier switch is defined as a daily switch. In addition, all tier switches are aligned to interval boundaries, which means that no interpolation is needed, thus reducing post processing of the interval data. It also means that the user will not be penalized for consumption in a higher tier when the actual usage was in a lower tier.

Defining the TOU schedule around windowed switch times allows the end user to plan accordingly to avoid usage in the higher tiers. For example, if a tier switch is defined as the time of the first interval received between 02:00 and 03:00, then usage can be limited to before 02:00 or after 03:00, whichever is the lower rate tier. Also, each meter (end customer) will record the same number of intervals (provided they have the same interval length) in each tier. For example, a tier defined as between 02:00-03:00 and 07:00-08:00 will result in 5 hours of LP data in that tier for each meter, regardless of how the LP intervals are aligned for the individual meters.

The system implementing TOU for the devices generating relative-time load profile data maintains, for each device it is accumulating TOU data, a record of what tier in which the device is currently accumulating usage data. In addition, the system maintains a record of the expected tier based on the current time and the TOU schedule in effect. As time progresses, the expected system TOU tier is changed based on the schedule. The system maintains a separate storage register for each TOU tier for each device.

As interval data is received from a device, the system stores the data in one of the device's TOU registers according to the following rules:

When interval data received:

Record the usage in the register corresponding to the device's current tier

If device's current tier is not equal to the expected tier:

Change the device's current tier to the expected tier

Figure 3:
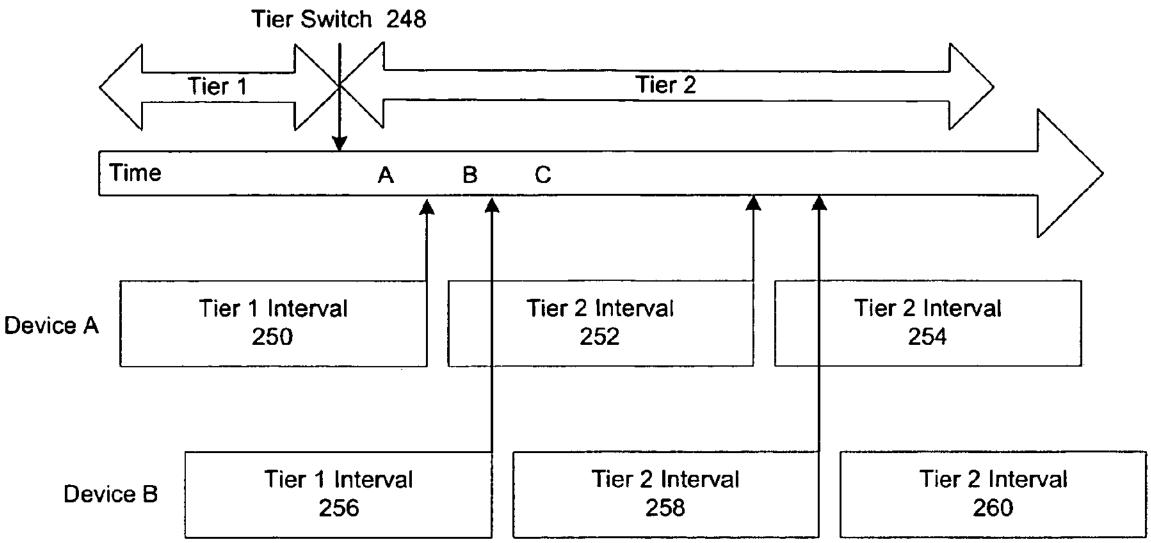
FIG. 3 illustrates an exemplary relative time line of received interval data.

For example, in FIG. 3, at point A in time, the system 200 has switched its expected tier to tier 2 because the TOU schedule indicated a tier switch 248 was scheduled in the recent past. Because the previous expected system tier was tier 1, the system accumulates usage for both device A and device B in their tier 1 registers. The current tier for these devices is tier 1. When the next interval of data is received from device A (interval 250), the system 200 stores this interval into device A's tier 1 register because tier 1 is the current tier for device A. The system 200 then changes device A's current tier to tier 2 because tier 2 is the expected system tier. When the next interval 252 from device A is received, it is stored in device A's tier 2 register. At point B in time, device A's current tier is tier 2, while device B's current tier is still tier 1.

With respect to device B, when interval 256 is received, the system 200 stores this interval into device B's tier 1 register because tier 1 is the current tier for device B. The system 200 then changes device B's current tier to tier 2 because tier 2 is the expected system tier. When the next interval 258 from device B is received, device B's current tier will be updated to tier 2. Finally, at point C in time, both device A and device B are accumulating usage (intervals 254 and 260) in tier 2.

It is appreciated that the TOU calculations may also be performed in the collector 116, in which case a reading system 200 would only need to download tier registers for TOU applications. Alternatively, LP could be retrieved by the system 200 and TOU information calculated after the fact. Performing the TOU calculation in the collector 116 has the advantages of reducing the amount of data to retrieve and providing alarm call-in support for usage in a "restricted" tier. An advantage to doing the calculations in the reading system 200 is the increased flexibility with respect to changing the tiers, decreased computational and storage requirements for the collector, and not having to download the TOU schedules and meter to schedule assignments to the collectors 116. For both options, the use of a windowed tier switch time is unchanged.

Figure 4:
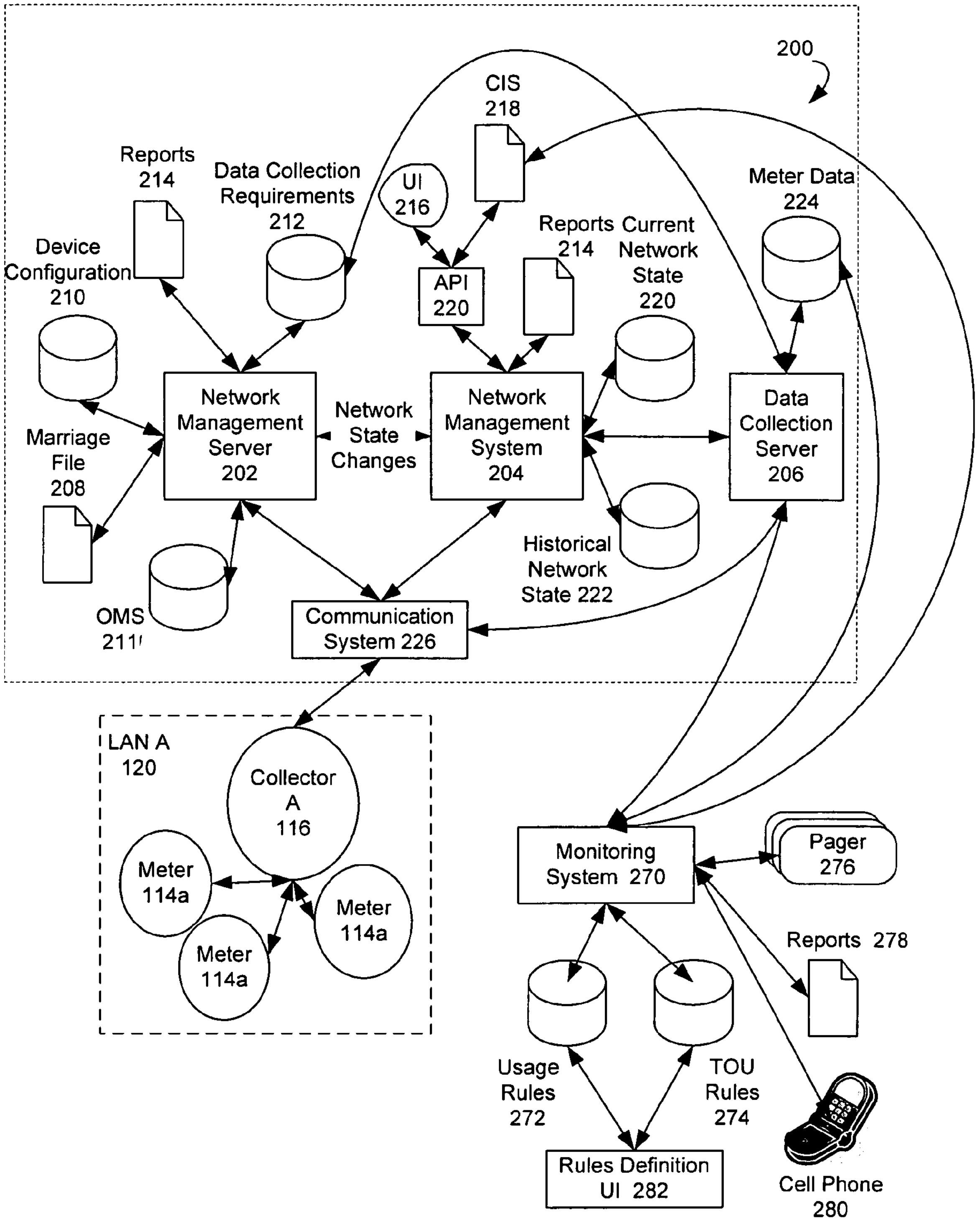
FIG. 4 illustrates an exemplary system to determine usage.

Referring now to FIG. 4, there is an embodiment of system 200 that includes a usage monitoring system 270 that monitors the consumption of a commodity, such as water or gas. The system 270 may optionally integrate to the CIS system 218 and historical load profile database 224. The collection system 200 implements monitoring based on, but not necessarily limited, to the following water usage attributes: interval usage, daily usage, total usage, time of use, historical usage, geographical information, street address, encompassing political boundary, lot size, water usage rate/service level agreement, and statistical products of usage, such as average daily usage, mean and variance of daily usage, etc.

The monitoring system 270 includes configurable usage filters 272 that allow for the classification of usage in terms of interval reading data. Usage filters 272 can be defined so that they are applied against individual interval readings, various aggregations of interval readings, and/or the statistical products of interval readings, etc. Configurable usage schedule filters 274 allow for the specification of usage restrictions in terms of various time of use criteria. Schedule filters can be defined so that they are applied against periods of the day, days, days of the week, etc. A filtering algorithm allows for the comparison of incoming and/or historical interval data against defined usage and schedule filters.

The usage filters 272 can be defined for detecting irrigation usage, theft, etc., while schedule filters 274 are defined for determining whether such usage is during a restricted period. Separate filtering for usage and time of use allows for changing of restrictions to accommodate seasonal, drought-related, or politically motivated changes in local policies. The interval data collected, while not real time data, should be of sufficient resolution to support the desired filtering. It is preferable that the interval data be collected hourly.

Where filtering is not based solely on interval readings, the system 200 aggregates incoming interval data for statistical comparisons, e.g., theft may be detectable based on significant statistical variations in daily usage patterns. All usage criteria applied by the filtering algorithm against incoming data, i.e., usage levels, period thresholds, etc., are preferably configurable. In cases where filtering by usage and/or time of use is not required, as when municipalities require separate metering for irrigation systems, or when usage is restricted by volume only, the filtering algorithm can be modified accordingly or deactivated.

The monitoring system 270 provides a user interface 282 through which a system operator can define usage/schedule filters, i.e., the rules for distinguishing usage patterns and restricted usage periods, inspect usage/schedule filters already defined in the system, and remove usage/schedule filters that are no longer applicable. The filters are defined as matching criteria that evaluate to a Boolean value. A value of true indicates the usage meets the specified filter criteria, while a value of false indicates normal usage.

As illustrated in FIG. 4, the system 270 integrates information from various sources and makes these variables available to the operator for use in filter definition. The data collection system provides recent load profile data and some level of account information. This account information can be used to lookup account-related information from a utility's CIS system 218, providing information such as street address, usage rate or agreement, and geographical information. The system 270 can also interface to a utility's historical database 224 of load profile or other usage information, and make this information available to the rule definer.

Figure 5:
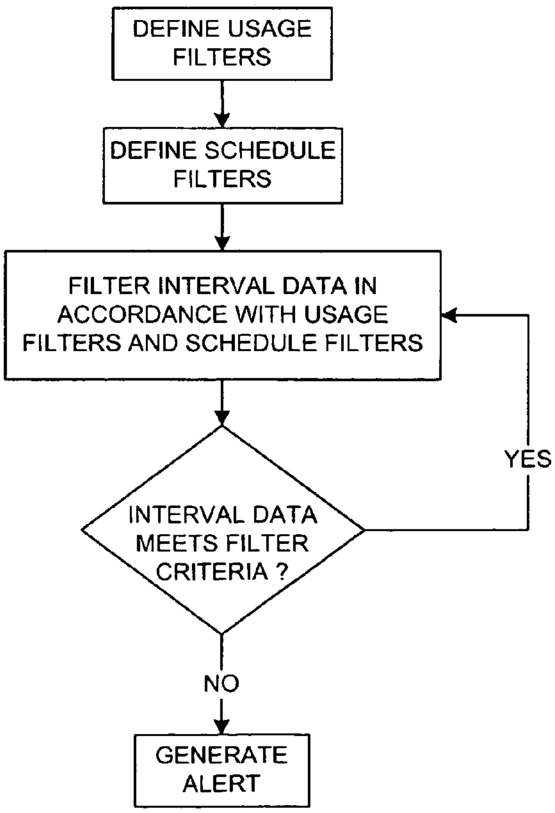
FIG. 5 illustrates one embodiment of a method of the present invention.

A simple example of an irrigation usage detection rule that could be implemented with typical load profile and CIS information for application to individual intervals is:

If the account is residential
  and If time (of the interval) is between 03:00 and 06:00
    and If Usage is greater than x
      Then suspect irrigation A simple example of a rule to determine whether irrigation usage is restricted is:

If the account is residential
  and If the street number of the account's address is even
    and The day is Tuesday
      Then suspect restricted irrigation Once restricted usage is detected, this usage will be communicated by the system to interested users. Possible ways this usage could be reported would be through a report 278 that is run daily or through an immediate notification system such as generating an email to a pager 276, cell phone 280 or other device. Such a system could notify field agents of suspected restricted use for immediate investigation. FIG. 5 illustrates the general steps of the foregoing method in flowchart form.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims.

For example, although a great deal of the discussion was based on the use of certain devices and communication paths, it should be appreciated that the contemplated embodiments include the use of any devices, communication paths and techniques. Moreover, although device configurations have been described herein, it should be appreciated that the devices are provided merely to provide an understanding of the many techniques contemplated by the embodiments. Those skilled in the art, having the benefit of the teachings of this specification, may affect numerous modifications thereto and changes may be made without departing from the scope and spirit of the invention.

What is claimed is:

1. A method of applying a Time-of-Use (TOU) schedule to a relative-time metering device, comprising:

determining an expected TOU tier in accordance with a TOU tier switch time;

receiving interval data from said relative-time metering device;

assigning said interval data to a current tier associated with said relative-time metering device;

changing said current tier associated with said relative-time metering to said expected TOU tier if said current tier is not equal to said expected TOU tier; and assigning subsequent interval data in said expected TOU tier.

2. The method of claim 1, further comprising defining said TOU tier switch time as a window of time having a maximum length equal to an interval over which said interval data is accumulated.

3. The method of claim 2, further comprising receiving interval data from plural relative-time metering devices, wherein each relative-time metering device communicates interval data within said window of time.

4. The method of claim 3, further comprising receiving a same number of intervals for each relative-time metering device for each expected TOU tier.

5. The method of claim 1, further comprising:

performing TOU calculations at a collector; and providing an alert based on usage determined in a predetermined tier.

6. The method of claim 1, further comprising:

performing TOU calculations at a reading system; and maintaining TOU schedules at said reading system.

7. A method of monitoring usage of a commodity, comprising:

defining usage filters that classify usage of said commodity in terms of interval data;

defining schedule filters in accordance with a Time-of-Use (TOU) schedule;

filtering interval data received from a relative-time metering device in accordance with said usage filters and said schedule filters; and generating an alert if said interval data meets criteria specified by said usage filters and said schedule filters.

8. The method of claim 7, further comprising interfacing with a customer information system to obtain at least one of a usage rate and geographical information pertaining to said relative-time metering device.

9. The method of claim 7, further comprising communicating said alert to a remote device to inform a provider that said interval data meets said criteria.

10. The method of claim 7, further comprising analyzing said interval data based on collected historical interval data and said schedule filters to determine if said alert should be generated.

11. The method of claim 7, further comprising performing a statistical analysis on said interval data to determine variations in usage over a predetermined period of time.

12. The method of claim 7, further comprising collecting said interval data on approximately an hourly basis.

13. A system for determining usage of a commodity, comprising:

a relative-time metering device that measures commodity usage in intervals as interval data;

a collector that receives said interval data from said relative-time metering device; and a reading system that receives said interval data from said collector, wherein said system for determining usage of a commodity sets a time-of-use (TOU) schedule and TOU tier switch times are defined as occurring within a window of time separating a first TOU tier and a second TOU tier, and wherein when said interval data associated with said relative-time metering device is received within said window of time, said interval data is assigned to said first TOU tier and a next interval data received from said relative-time metering device is assigned to said second TOU tier.

14. The system of claim 13, wherein said window has a maximum length equal to a collection time associated with said interval data.

15. The system of claim 14, wherein said collection time is approximately one hour.

16. The system of claim 13, wherein said collector aggregates interval data from plural relative-time metering devices and wherein said plural relative-time metering devices each collect said interval data for substantially the same amount of time per interval.

17. The system of claim 16, wherein said plural relative-time metering devices transmit said interval data at random times to said collector.

18. The system of claim 13, further comprising a monitoring system that generates alerts if said interval data meets criteria specified by usage filters that classify usage of said commodity in terms of interval data and schedule filters set in accordance with said TOU schedule.

19. The system of claim 18, further comprising an interface to a customer information system to obtain at least one of a usage rate and geographical information pertaining to said relative-time metering device.

20. The system of claim 18, further comprising analyzing said interval data based on collected historical interval data and said schedule filters to determine if said alerts should be generated.

* * * * *